(12) United States Patent
Ueda et al.

(10) Patent No.: US 8,610,197 B2
(45) Date of Patent: Dec. 17, 2013

(54) NONVOLATILE MEMORY HAVING GATE ELECTRODE AND CHARGE STORAGE LAYER FORMED RESPECTIVELY OVER OPPOSITE SURFACES OF SEMICONDUCTOR LAYER

(75) Inventors: Naoki Ueda, Osaka (JP); Yoshimitsu Yamauchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 250 days.

(21) Appl. No.: 13/201,584

(22) PCT Filed: Dec. 14, 2009

(86) PCT No.: PCT/JP2009/006858
§ 371 (c)(1),
(2), (4) Date: Aug. 25, 2011

(87) PCT Pub. No.: WO2010/092652
PCT Pub. Date: Aug. 19, 2010

(65) Prior Publication Data
US 2011/0303964 A1    Dec. 15, 2011

(30) Foreign Application Priority Data
Feb. 16, 2009    (JP) .................................. 2009-033131

(51) Int. Cl.
*H01L 29/786*    (2006.01)
*H01L 29/788*    (2006.01)

(52) U.S. Cl.
USPC ................... 257/319; 257/320; 257/E29.275; 257/E29.3

(58) Field of Classification Search
USPC .................................. 257/E21.624, E29.299
See application file for complete search history.

(56) References Cited

U.S. PATENT DOCUMENTS

| 5,982,004 A | 11/1999 | Sin et al. | |
| 2008/0303077 A1* | 12/2008 | Kuo | 257/316 |

FOREIGN PATENT DOCUMENTS

| JP | 4-72676 A | 3/1992 |
| JP | 7-30001 A | 1/1995 |
| JP | 11-74540 A | 3/1999 |
| JP | 2002-50762 A | 2/2002 |
| JP | 2005-353912 A | 12/2005 |
| JP | 2008-283013 A | 11/2008 |

OTHER PUBLICATIONS

International Search Report (ISR) issued in PCT/JP2009/006858 (International application) mailed in Mar. 2010 for Examiner consideration.

* cited by examiner

*Primary Examiner* — Stephen W Smoot
(74) *Attorney, Agent, or Firm* — Chen Yoshimura LLP

(57) ABSTRACT

Provided is a nonvolatile memory 10 having a selective gate SG formed below a silicon layer 14, which is to be a channel region formed between a source region S and a drain region D of a transistor, through a gate insulating film 15 between the silicon layer and the selective gate, a floating gate FG formed on a part over the silicon layer 14 through a gate insulating film 16, and a control gate CG connected to the floating gate FG. The selective gate SG has one end overlapping the source region S through the gate insulating film 15, and the floating gate FG has one end overlapping the drain region D through the gate insulating film 16, and the other end separated from the source region S and overlapping the silicon layer 14 through the gate insulating film 16. Thus, a nonvolatile memory whose performance is not deteriorated even when it is formed on an insulating substrate having a low heat dissipating characteristic can be achieved.

4 Claims, 8 Drawing Sheets

NONVOLATILE MEMORY HAVING GATE ELECTRODE AND CHARGE STORAGE LAYER FORMED RESPECTIVELY OVER OPPOSITE SURFACES OF SEMICONDUCTOR LAYER

TECHNICAL FIELD

The present invention relates to a nonvolatile memory, and specifically, to a nonvolatile memory constituted of transistors and to a display device using such a nonvolatile memory.

BACKGROUND ART

Until now, flash memories have been known as a type of nonvolatile memories. A memory cell used in these flash memories has a laminated structure in which a floating gate is formed over a substrate through a tunnel oxide film and a control gate is formed in addition over the substrate through a gate insulating film. The operation principle of this memory cell is briefly explained as follows. During a write operation, electrons (or holes) are injected from a drain to a floating gate using a voltage difference between the control gate and the drain. During an erase operation, electrons (or holes) in the floating gate are released into the drain by a similar voltage control between the control gate and the drain. Assume that the channel is of P-type, and the source and the drain are of n-type. Then, the channel is turned off when electrons are present in the floating gate whereas the channel is turned on when electrons are absent in the floating gate. Accordingly, the memory cell functions as a nonvolatile memory.

Technologies for constructing such a nonvolatile memory with thin film transistors (TFTs) have been disclosed in Paten Document 1, for example. FIG. 14 is a schematic view showing a configuration of a nonvolatile memory (nonvolatile transistor) that is constituted of TFTs in Patent Document 1.

In the nonvolatile transistor shown in FIG. 14, a source region 142A (S), a drain region 142B (D) and a channel region 142C (Ch) are formed in an active region 125B as element regions to function as a transistor. In addition, a floating gate 125A (FG) is formed to face the channel region 142C through a gate insulating film 124B, and a control gate 123 (CG) is formed to face the floating gate 125A through an interlayer insulating film 124A.

Here, the principle of a write operation when the aforementioned nonvolatile transistor is an N channel thin film transistor (N channel TFT) is explained. When data "1" is written into an N channel TFT, the source region 142A is grounded and a high voltage is applied to the drain region 142B and the control gate 123, thereby injecting high-energy electrons (hot electrons) from the drain region 142B to the floating gate 125A. Then, hot electrons are stored in the floating gate 125A and data "1" is written into the N channel TFT.

RELATED ART DOCUMENT

Patent Document

Patent Document 1: Japanese Patent Application Laid-Open Publication No. 2005-353912 (Laid open on Dec. 22, 2005)

SUMMARY OF THE INVENTION

Problems to be Solved by the Invention

The aforementioned nonvolatile transistor, however, has a problem that transistor characteristics deteriorate. Specifically, in the aforementioned configuration, as shown in FIG. 15, high voltages need to be applied to the drain region D and the control gate CG (for example, 6 to 13 V to the drain electrode and 10 to 15 V to the control gate electrode) in order to generate hot electrons ("e" in the figure). As a result, a high current flows between the source region and the drain region, and the nonvolatile transistor generates heat (self-heating), deteriorating transistor characteristics. Particularly, when the aforementioned nonvolatile transistor is formed on an insulating substrate having a low heat dissipating characteristic, such as a glass substrate and the like constituting a liquid crystal panel and the like, transistor characteristics deteriorate notably due to self-heating. Therefore, it is difficult to apply the aforementioned nonvolatile transistor to a liquid crystal panel.

The present invention seeks to address the aforementioned existing problem, and has an object of realizing a nonvolatile memory that does not deteriorate performance even when it is formed on an insulating substrate having a low heat dissipating characteristic and a method for manufacturing such a nonvolatile memory.

Means for Solving the Problems

A nonvolatile memory of the present invention, in order to solve the aforementioned problems, is a nonvolatile memory that retains data in a nonvolatile manner and that is constituted of a transistor, wherein a first gate electrode is formed over at least one portion of one surface of a semiconductor layer that becomes a channel region formed between a source region and a drain region of the aforementioned transistor through a first insulating film; a charge storage layer is formed through a second insulating layer over at least one portion of the other surface of the aforementioned semiconductor layer on an opposite side from the surface having the aforementioned first insulating film; a control gate electrode that is connected to the aforementioned charge storage layer is provided; at least one end of the aforementioned first gate electrode overlaps the aforementioned source region through the aforementioned first insulating film; and one end of the aforementioned charge storage layer overlaps the aforementioned drain region through the aforementioned second insulating film and the other end is separated from the aforementioned source region and overlaps the aforementioned semiconductor layer through the aforementioned second insulating film.

Hereinafter, it is assumed that, in the region between the source region and the drain region, a region where the first gate electrode is formed is a region A and that a region where the charge storage layer is formed is a region B.

In the aforementioned configuration, when the source is grounded and high voltages are applied to the drain and the control gate electrodes and a low voltage is applied to the first gate electrode, because in the region A, a charge storage layer is not formed and only the first gate electrode is disposed to overlap the source region, the channel potential in the region A becomes lower than the channel potential in the region B. As a result, the potential difference between the source and the drain is concentrated in the bordering part of the region A and the region B, and a high electric field occurs in the bordering part (a high electric field is generated in a direction (horizontal direction) from the source region to the drain region). Therefore, during a write operation, electrons (hot electrons) in the source region become excited by this high electric field in this bordering part and become attracted to the charge storage layer side. Data are written when the electrons are taken into the charge storage layer.

Thus, according to the aforementioned configuration, even if a potential in a portion of the channel region is set lower, hot electrons can be injected into the charge storage layer by excitation in a region where a potential difference occurs (high electric field region). In addition, because a potential in the channel region can be lowered, the amount of the current flowing between the source region and the drain region can be made lower than the conventional current amount, thereby preventing deterioration of transistor characteristics due to self-heating of the transistor. Therefore, the nonvolatile memory of the present invention does not deteriorate performance even when it is formed on an insulating substrate having a low heat dissipating characteristic such as a glass substrate and the like constituting a liquid crystal panel.

The method for manufacturing the nonvolatile memory of the present invention, in order to solve the aforementioned problems, is a method for manufacturing a nonvolatile memory that retains data in a nonvolatile manner and that is constituted of a transistor, and includes the following steps: a step of forming a semiconductor layer that becomes a channel region between a source region and a drain region of the aforementioned transistor; a step of forming a first gate electrode over at least one portion of one surface of the aforementioned semiconductor layer so that at least one end of the first gate electrode overlaps the aforementioned source region through a first insulating film; a step of forming a charge storage layer over at least one portion of the other surface of the aforementioned semiconductor layer on an opposite side from the surface having the aforementioned first insulating film so that one end of the charge storage layer overlaps the aforementioned drain region through a second insulating film and that the other end is separated from the aforementioned source region and overlaps the aforementioned semiconductor layer; and a step of forming a control gate electrode that is connected to the aforementioned charge storage layer.

According to the aforementioned method, effects from the configuration of the aforementioned nonvolatile memory can be obtained.

Effects of the Invention

As described above, the nonvolatile memory of the present invention is configured such that at least one end of the aforementioned first gate electrode overlaps the aforementioned source region through the aforementioned first insulating film, and that one end of the aforementioned charge storage layer overlaps the aforementioned drain region through the aforementioned second insulating film and the other end is separated from the aforementioned source region and overlaps the aforementioned semiconductor layer through the aforementioned second insulating film.

Furthermore, the method for manufacturing the nonvolatile memory of the present invention includes the following steps: a step of forming the first gate electrode over at least one portion of a surface of the aforementioned semiconductor layer so that at least one end of the first gate electrode overlaps the aforementioned source region through the first insulating film; and a step of forming the charge storage layer over at least one portion of the other surface of the aforementioned semiconductor layer on an opposite side from the surface having the aforementioned first insulating film so that one end of the charge storage layer overlaps the aforementioned drain region through the second insulating film and that the other end is separated from the aforementioned source region and overlaps the aforementioned semiconductor layer.

Accordingly, because deterioration of transistor characteristics due to self-heating of the transistor can be prevented, performance of the aforementioned nonvolatile memory is not deteriorated even when it is formed on an insulating substrate having a low heat dissipating characteristic.

DETAILED DESCRIPTION OF EMBODIMENTS

Examples of embodiments of the present invention are described below using FIGS. 1 to 13. Below, cases in which the nonvolatile memories of the present invention are applied to a liquid crystal display device are described below.

Embodiment 1

Figure 1:
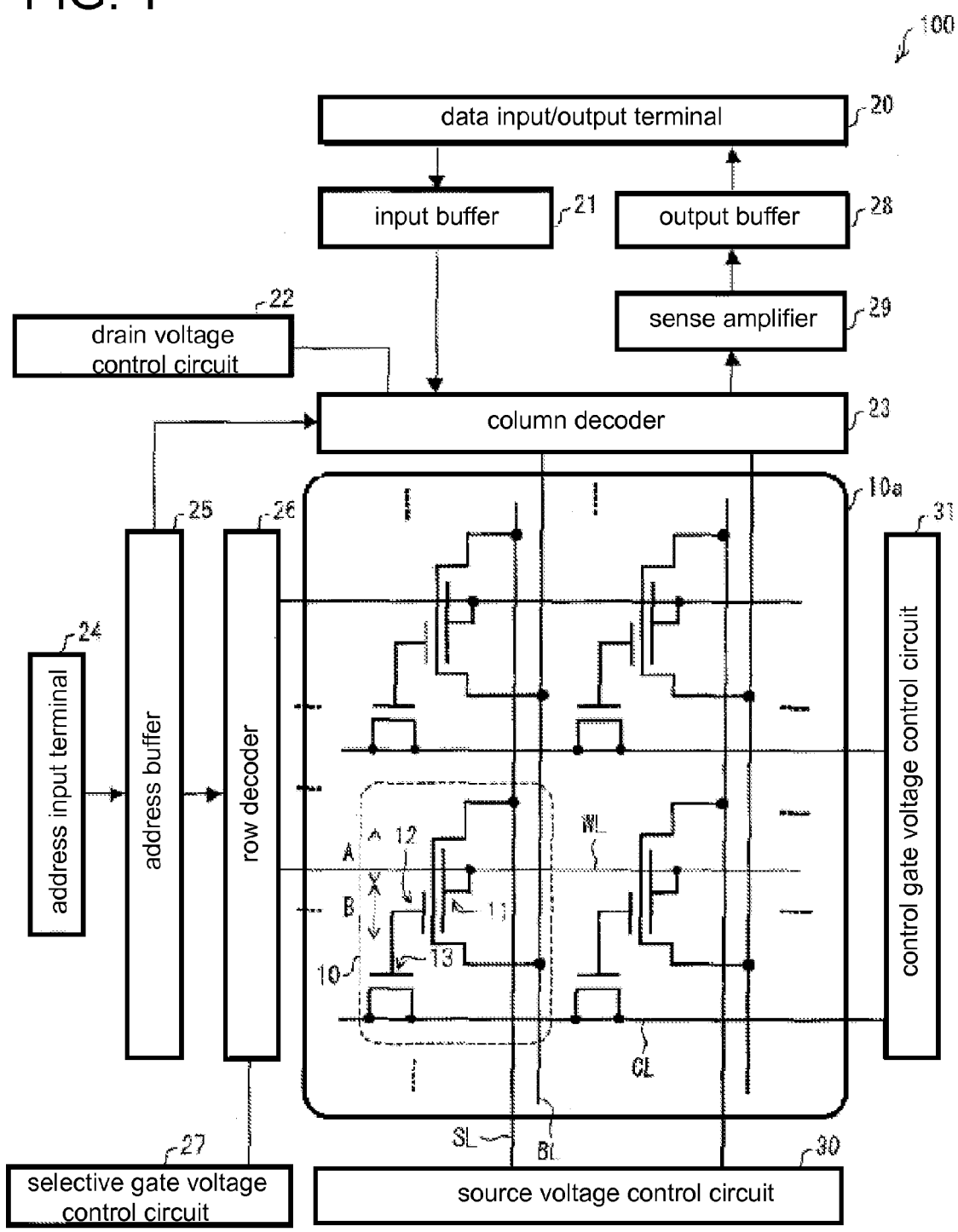
FIG. 1 is a block diagram showing a schematic configuration of a liquid crystal display device according to Embodiment 1.

FIG. 1 is a block diagram showing a schematic configuration of a liquid crystal display device according to Embodiment 1. As shown in FIG. 1, this liquid crystal display device (display device) 100 is constituted of a memory cell array 10a that is constituted of a plurality of memory cells (nonvolatile memories) 10 arranged in a matrix, a data input/output terminal 20, an input buffer 21, a drain voltage control circuit 22, a column decoder 23, an address input terminal 24, an address buffer 25, a row decoder 26, a selective gate voltage control circuit 27, an output buffer 28, a sense amplifier 29, a source voltage control circuit 30, a control gate voltage control circuit 31, and a main control unit (not shown in the figure) that controls the respective control circuits, buffers and the like.

The memory cell array 10a is constituted of a plurality of electrically rewritable memory cells 10 respectively arranged in the row direction as well as in the column direction, thus arranged in a matrix. Each memory cell 10 is constituted of a selective transistor 11 for selecting a memory cell, a memory transistor 12 for storing information, and a MOS capacitor 13.

Here, the gate of the memory transistor 12 and one terminal of the MOS capacitor 13 are electrically connected. As a result, a nonvolatile memory transistor (nonvolatile memory) in which the gate of the memory transistor 12 and one end of the MOS capacitor 13 become a floating gate (second gate electrode, floating gate FG) and the other terminal of the MOS capacitor 13 (the other end on the side that does not connect to the gate of the memory transistor) becomes a control gate CG (control gate electrode) is constructed.

The selective transistor 11 and the memory transistor 12 are formed so that the first gate insulating film, a channel, and the second gate insulating film are disposed in this order between them. More specifically, in the region A (the first region) in the figure, the gate electrode (selective gate SG) of the selective transistor 11 is formed over the channel through the first gate insulating film, but the gate electrode (floating gate FG) of the memory transistor 12 is not formed over the channel through the second gate insulating film. In the region B (the second region) in the figure, the gate electrode of the selective transistor 11 is formed over the channel through the first gate insulating film and the gate electrode of the memory transistor 12 is also formed over the channel through the second gate insulating film. Therefore, in the region B, the selective transistor 11 and the memory transistor 12 are arranged to face each other through gate insulating films (the first and the second gate insulating films) that are formed so that they are mutually separated with the channel formed between them. Alternatively, on the drain side of the memory transistor 12 in the region B, only the gate electrode of the memory transistor 12 may be formed over the channel through the second gate insulating film.

Therefore, the memory cell 10 is configured such that at least two types of channels, the region B where the memory transistor 12 and the selective transistor 11 are formed to face each other as parallel circuits and the region A, which is formed to connect to the region B, where only the selective transistor 11 is formed, are connected in series.

In each memory cell 10, a control gate of the MOS capacitor 13 is connected to a control line CL, and a gate electrode (selective gate SG) of the selective transistor 11 is connected to a word line WL, and a drain terminal of the memory cell 10 is connected to a bit line BL, and a source terminal of the memory cell 10 is connected to a source line SL. This embodiment is explained using a configuration that the control line CL, the bit line BL and the source line SL respectively extend in the column direction and the word line WL extends in the row direction as an example.

The drain voltage control circuit 22 controls the voltage applied to the bit line BL, and the selective gate voltage control circuit 27 controls the voltage applied to the word line WL. The source voltage control circuit 30 controls the voltage applied to the source line SL, and the control gate voltage control circuit 31 controls the voltage applied to the control line CL.

When an address signal inputted from the address input terminal 24 is given, the address buffer 25 divides the given address signal into a column address and a row address, and inputs them to the column decoder 23 and the row decoder 26, respectively. The column decoder 23 selects a bit line BL and a control line CL corresponding to the inputted column address, and the row decoder 26 selects a word line WL corresponding to the inputted row address. Then, through the input buffer 21, data inputted from the data input/output terminal 20 is written into a memory cell 10 selected by the column decoder 23 and the row decoder 26. Information that has been written into a memory cell selected by the column decoder 23 and the row decoder 26 is retrieved and amplified through the sense amplifier 29, and is outputted to the data input/output terminal 20 through the output buffer 28.

Figure 2:
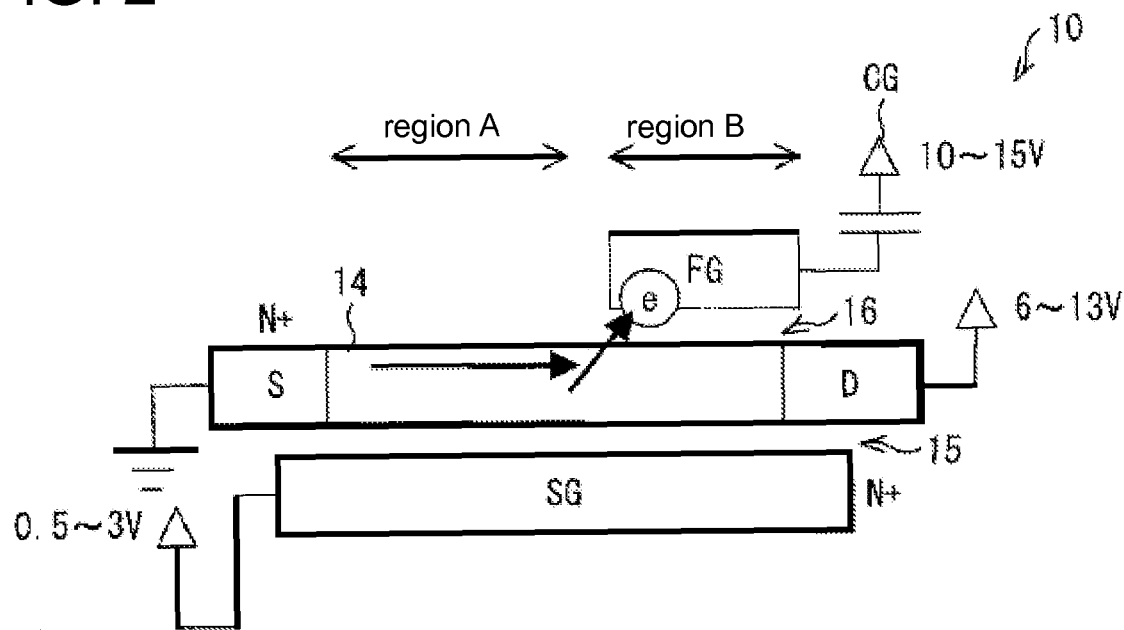
FIG. 2 is a schematic view showing a configuration of a memory cell according to Embodiment 1.

Next, a configuration of each memory cell 10 is described in detail. FIG. 2 is a schematic view showing a configuration of a memory cell 10, and FIG. 3 is an equivalent circuit diagram of the memory cell 10.

Figure 3:
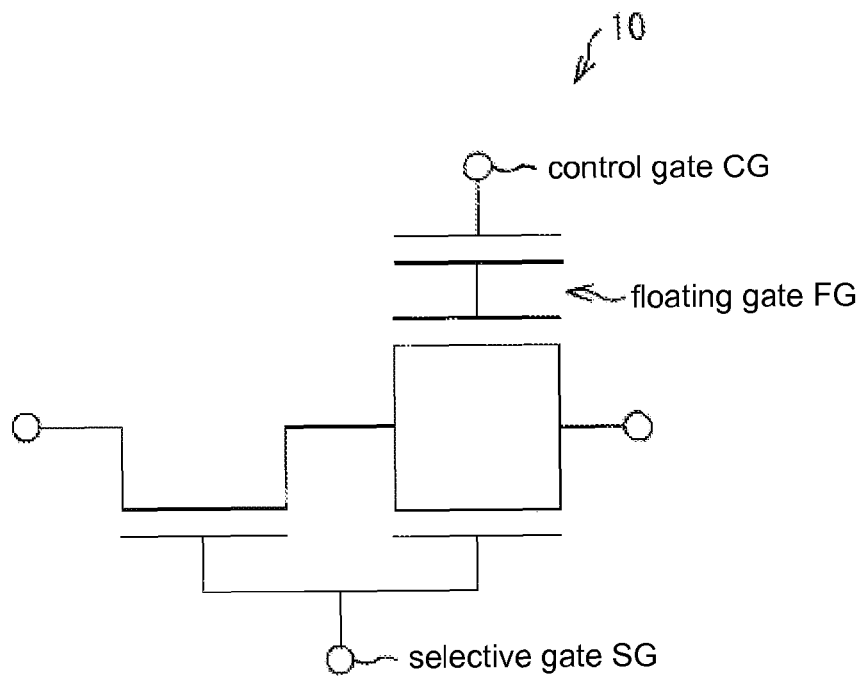
FIG. 3 is an equivalent circuit diagram of the memory cell shown in FIG. 2.

As shown in FIGS. 2 and 3, in the memory cell 10, a selective gate SG (the first gate electrode) is formed to connect to (overlap) a source region S and a drain region D through a gate insulating film 15 below a silicon layer 14 that becomes a channel between a pair of source S and drain D regions of the transistor. A floating gate FG (the second gate electrode) that becomes a charge storage layer is formed over the silicon layer 14 to connect to (overlap) the drain region D through a gate insulating film 16. Furthermore, the floating gate FG does not connect to (overlap) the source region S, and in the region A (region between the end of the floating gate FG on the source side and the source), is not formed over the silicon layer 14.

Therefore, between the source S and drain D regions, in the region A that is adjacent to the source region S, the selective gate SG is formed below the silicon layer 14, and in the region B that is adjacent to the region A and the drain region D, the selective gate SG is formed below the silicon layer 14 and the floating gate FG is formed over the silicon layer 14.

Therefore, the channel of the silicon layer 14 in the region A is controlled only by the MOS transistor by the selective gate SG that becomes the selective transistor 11, and the channel of the silicon layer 14 in the region B is controlled by two transistors connected in parallel: the MOS transistor formed by the selective gate SG extending from the region A and the MOS transistor formed by the floating gate FG.

As shown in the equivalent circuit diagram in FIG. 3, the memory cell 10 is constituted of a first, second, and third transistors. In the first transistor (selective transistor 11), a gate electrode (selective gate) is connected to a word line WL, and a source terminal (first conductive terminal) is connected to a source line SL (signal line). In the second transistor (selective transistor 11), a gate electrode (selective gate) is connected to the word line WL, and the source terminal (first conductive terminal) is connected to the drain terminal (second conductive terminal) of the first transistor, and the drain terminal (second conductive terminal) is connected to a bit line BL. In the third transistor (memory transistor 12), a gate electrode is connected to a control line CL through a capacitance, and a source terminal (first conductive terminal) is connected to the drain terminal (second conductive terminal) of the first transistor, and the drain terminal (second conductive terminal) is connected to a bit line BL.

Figure 4:
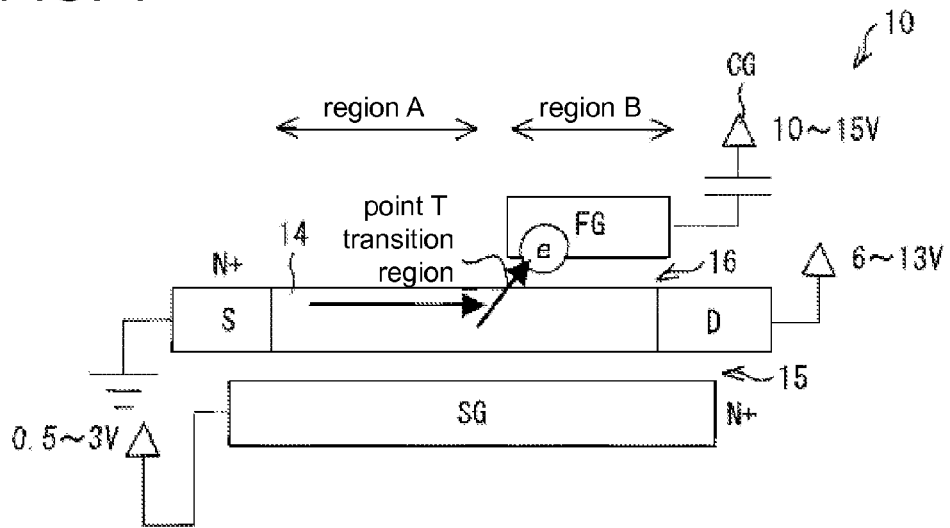
FIG. 4 is a diagram to explain a write operation in the memory cell shown in FIG. 2
Figure 5:
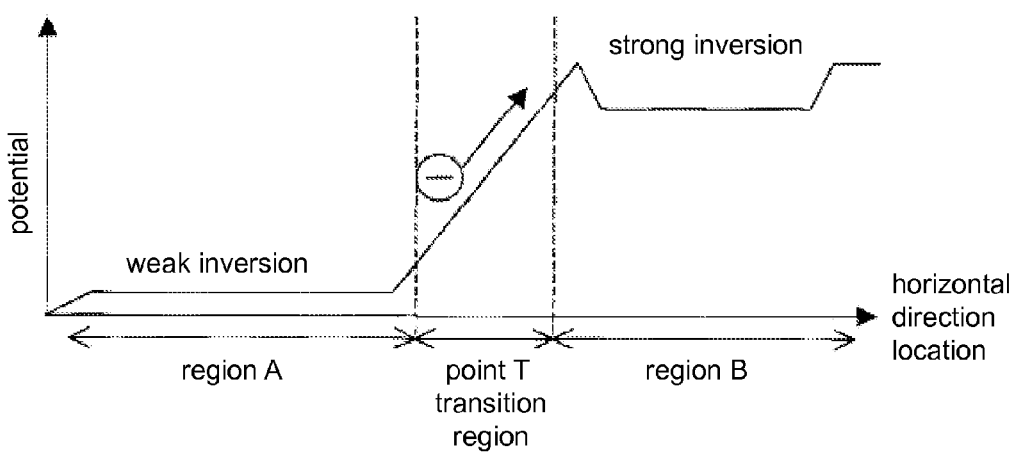
FIG. 5 is a graph conceptually showing the transition of potential change corresponding to locations in a horizontal direction in a channel region formed on a semiconductor layer during a write operation in the memory cell shown in FIG. 4.
Figure 6:
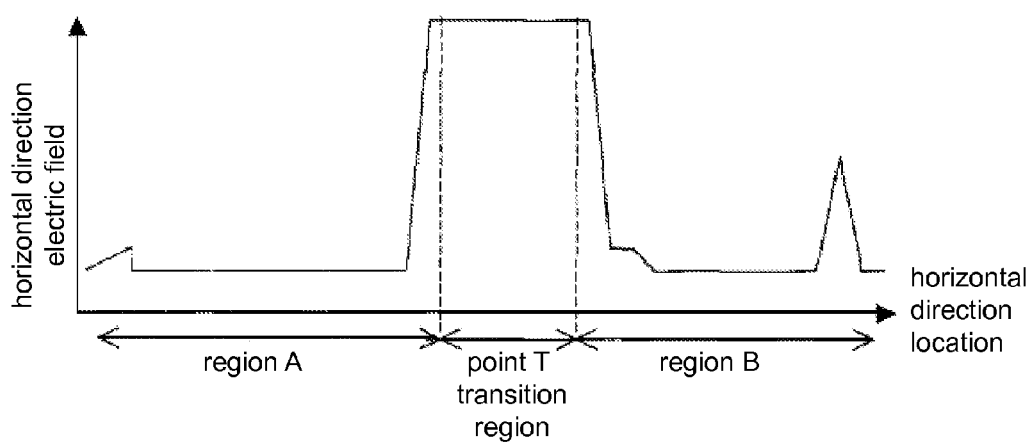
FIG. 6 is a graph conceptually showing the transition of the size of an electric field in a horizontal direction corresponding to locations in a horizontal direction in a channel region formed on a semiconductor layer during a write operation in the memory cell shown in FIG. 4.

Next, a write operation of the memory cell 10 is explained using FIGS. 4 to 6. The memory cell 10 of this embodiment is characterized by having a configuration in which two selective transistors 11 (first and second selective transistors) are connected in series and a configuration where the memory transistor 12 and the selective transistor 11 (second selective transistor) are connected in parallel. When a threshold voltage of the selective transistor 11 or a voltage close to the threshold voltage is applied to a gate electrode of the region A having only the selective transistor 11, a source side injection in which a write current between the source and drain regions during a write operation is controlled is enabled. Characteristics of write operation of the memory cell 10 having the aforementioned configuration are described in detail below.

As a condition of a voltage applied during a write operation, following voltages are respectively applied to the memory cell 10 to which data are written: approximately 6 to 13 V on the bit line BL; approximately 10 to 15 V on the control line CL; approximately 0.5 to 3 V on the word line WL, which is close to the threshold voltage; and 0V on the source line SL, which is a ground voltage.

When the aforementioned respective voltages are applied to the respective parts of the memory cell 10, a channel region is formed on a surface of the semiconductor layer in the region A and the region B of the semiconductor layer (silicon layer 14), respectively, and the source and the drain become electrically connected. Accordingly, electrons in a source impurity diffusion region are attracted to a drain impurity diffusion region by a positive voltage (approximately 4 V) applied through a bit line BL. Therefore, electrons in the source impurity diffusion region move to the region B via a channel region formed in the region A and a bordering region of the region A and the region B.

Here, the electric potential of the channel of the region A is close to the ground potential in the selective gate SG because the region A is adjacent to the source region. Meanwhile, the electric potential of the channel of the region B is higher due to the drain voltage and the high positive control gate voltage. As a result, a potential difference between the source and the drain is practically concentrated at a point T (see FIG. 4) where the region A and the region B are connected, and a high electric field occurs in this part (high electric field in a horizontal direction is generated).

FIG. 5 is a graph conceptually showing the transition of potential change corresponding to locations in a horizontal direction in a channel region formed on a semiconductor layer during a write operation, and FIG. 6 is a graph conceptually showing the transition of the size of an electric field in a horizontal direction corresponding to locations in a horizontal direction in a channel region formed on a semiconductor layer during a write operation.

As described above, due to a high potential difference at the point of contact T of the region A and the region B, a high electric field occurs in this region (point T) (see FIG. 6). As electrons in the source region moves near the point T, they become excited by this high electric field, thereby increasing the potential (see FIG. 5). Here, during the aforementioned write operation, because positive voltages are applied, through the control line CL, to the drain region, the control gate CG, and to the floating gate FG that is capacitively coupled to the control gate CG, the hot electrons are attracted to the side of the floating gate FG. Information is written when these hot electrons are taken into the floating gate FG. Therefore, under the configuration of the memory cell shown in FIG. 2, information can be written into the memory cell 10 by using the aforementioned write operation.

As described above, according to the memory cell 10 of this embodiment, a write operation can be performed with a low (<10 uA/cell) channel current that does not cause element deterioration from self-heating because of a weak inversion state of the channel in the region A (the first region). Therefore, according to the aforementioned memory cell 10, even when it is formed on an insulating substrate having a low heat dissipating characteristic, such as a glass substrate or the like, transistor characteristics do not deteriorate. Therefore, this memory cell 10 is suitable for a liquid crystal display device.

Here, as a conventional memory cell, there has been suggested a configuration having double-layered gate electrodes in a region of a semiconductor substrate layer between an impurity diffusion region that becomes a drain and an impurity diffusion region that becomes a source by forming a selective gate SG so that a portion of the selective gate SG is superposed over a floating gate FG in this region.

Figure 7:
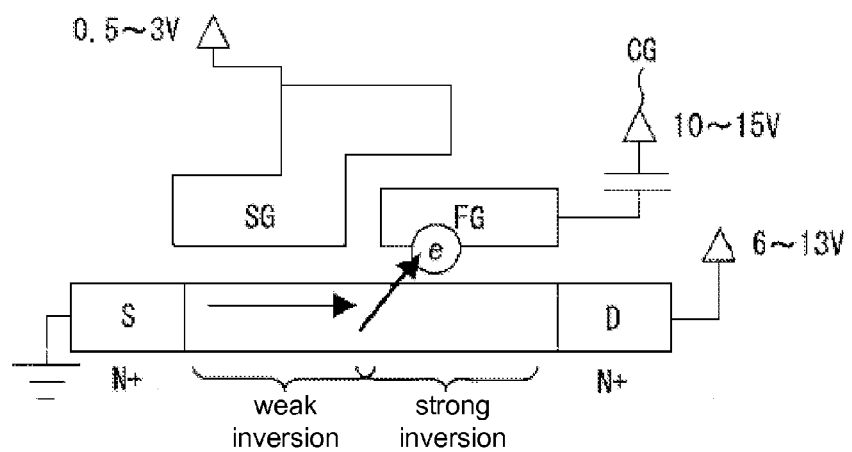
FIG. 7 is a schematic view showing a configuration of an example of a conventional memory cell.

FIG. 7 is a schematic view showing a configuration of an example of this conventional memory cell. As shown in the figure, the selective gate SG is formed so that a portion of the selective gate SG is superposed over a portion of the upper part of the floating gate FG and a side wall part of the floating gate FG through an insulating film.

In this configuration, a positive voltage is applied to the drain and the source is at a ground voltage. Then, positive voltages are applied to the floating gate FG and the selective gate SG in this order. When a positive voltage is applied to the selective gate SG, the channel formed in a region below the selective gate SG becomes a weak inversion state. When a positive voltage is applied to the floating gate FG, the channel formed in a region below the floating gate FG becomes a strong inversion state. As a result, because a high electrical field is generated near the border between these regions, electrons supplied from the source side become excited by this high electrical field. These electrons are injected from the source side to the floating gate FG, and information is written (source side injection). According to this write operation method, injection efficiency can be improved compared to a channel hot electron method (the aforementioned Patent Document 1, for example).

However, because in standard methods for manufacturing liquid crystal panels, the gate electrode layer that can be formed after a silicon layer has been formed is just one layer, an additional step is required. Furthermore, it is difficult to increase the breakdown voltage of an insulating film disposed between the double-layered gate electrodes: the selective gate and the floating gate.

From this perspective, in the memory cell 10 of the present embodiment, control of the amount of hot electrons generated primarily depends only on layout design parameters of the selective gate SG and the floating gate FG, and on the applied voltage conditions during a write operation, and does not depend on the concentration distribution of drain impurity diffusion as in conventional cases. Furthermore, a conductive layer used as a selective gate SG can be formed by changing a design rule of a light-shielding layer (black matrix) for shielding leaked light that is a part of a standard method for manufacturing liquid crystal panels. Accordingly, write performance can be optimized solely by changing a design rule without changing or adjusting a standard method for manufacturing liquid crystal panels.

A method for manufacturing a memory cell 10 mainly includes the following steps: a step of forming a silicon layer 14 that becomes a channel region between the source region S and the drain region D of the transistor; a step of forming a selective gate SG below at least one portion of the silicon layer 14 so that at least one end of the selective gate SG overlaps the source region S through a gate insulating film 15 (selective gate forming step); a step of forming a charge storage layer (floating gate FG) over at least one portion of the silicon layer 14 so that one end of the charge storage layer overlaps the drain region D through a gate insulating film 16 and that the other end is separated from the source region S and overlaps the silicon layer 14 through a gate insulating film 16 (floating gate forming step); and a step of forming a control gate CG that is connected to the charge storage layer (control gate forming step). Furthermore, in the aforementioned selective gate forming step, the selective gate is preferably made of the same material as the light-shielding layer of the liquid crystal panel and is preferably formed in the same layer as the light-shielding layer of the liquid crystal panel.

Accordingly, in the memory cell 10 of this embodiment, in addition to the effect of preventing deterioration of transistor characteristics due to self-heating, the effect of increasing the breakdown voltage of an insulating film disposed between the selective gate and the floating gate can be obtained without complicating the manufacturing steps even when the memory cell is applied to a liquid crystal panel (liquid crystal display device).

Embodiment 2

Embodiment 2 according to the present invention is explained below. To facilitate explanation, the same reference characters are used for members having the same functions as the members shown in the aforementioned Embodiment 1, and explanations thereof are omitted. Furthermore, terms defined in Embodiment 1 are also used in this embodiment in the same manner as Embodiment 1 unless specifically indicated otherwise.

The schematic configuration of a liquid crystal display device of Embodiment 2 is the same as the configuration shown in Embodiment 1, and includes a memory cell array 10a that is constituted of a plurality of memory cells 40 arranged in a matrix.

The memory cell array 10a is constituted of a plurality of electrically rewritable memory cells 40 respectively arranged in the row direction as well as in the column direction, thus arranged in a matrix. Each memory cell 40 is constituted of a selective transistor 11 for selecting a memory cell, a memory transistor 12 for storing information, and a MOS capacitor 13.

Figure 8:
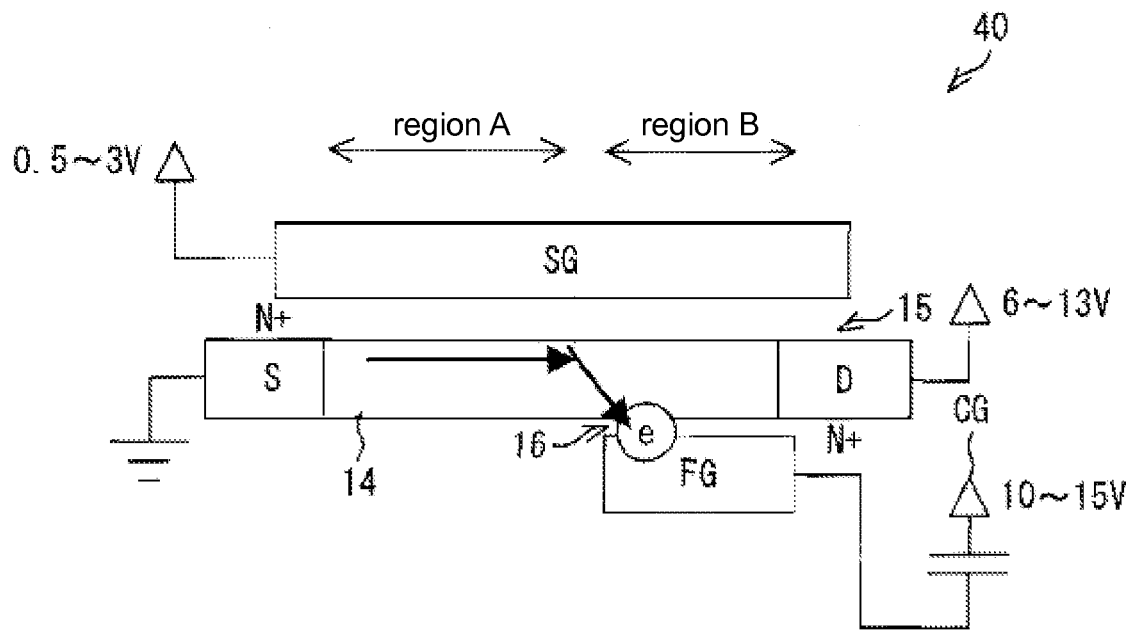
FIG. 8 is a schematic view showing a configuration of a memory cell according to Embodiment 2.
Figure 9:
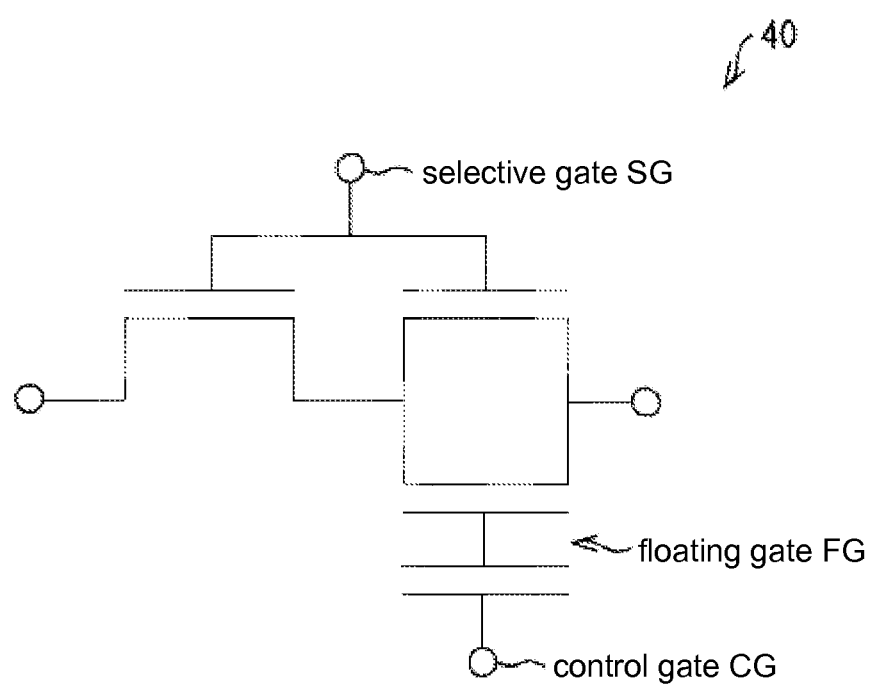
FIG. 9 is an equivalent circuit diagram of the memory cell shown in FIG. 8.

FIG. 8 is a schematic view showing a configuration of the memory cell 40 according to Embodiment 2, and FIG. 9 is an equivalent circuit diagram of the memory cell 40. The memory cell 40 according to Embodiment 2 has a configuration that the positions (in a vertical direction on paper in FIG. 2) of the selective transistor 11 and the memory transistor 12 of the memory cell 10 of Embodiment 1 shown in FIG. 2 (and FIG. 3) are reversed.

As shown in FIGS. 8 and 9, in the memory cell 40, a floating gate FG that becomes a charge storage layer is formed below a silicon layer 14 that becomes a channel through a gate insulating film 16 in a region B (the second region) between a pair of source S and drain D regions of the transistor. The floating gate FG is adjacent to (overlaps) the drain region D, and does not connected to (overlap) the aforementioned source region, and is not formed below the silicon layer 14 in a region A (the first region, the region between the end of the floating gate FG on the source side and the source). Furthermore, a selective gate SG is formed over the silicon layer 14 so that it connects to (overlaps) the source region S and the drain region D through a gate insulating film 15.

Therefore, between the source S and drain D regions, in the region A that is adjacent to the source region S, the selective gate SG is formed over the silicon layer 14, and in the region B that is adjacent to the region A and the drain region D, the selective gate SG is formed over the silicon layer 14 and the floating gate FG is formed below the silicon layer 14.

Therefore, the channel of the silicon layer 14 in the region A is controlled only by the MOS transistor formed by the selective gate SG that becomes the selective transistor 11, and the channel of the silicon layer 14 in the region B is controlled by two transistors connected in parallel: the MOS transistor formed by the selective gate SG that extends from the region A and a MOS transistor formed by the floating gate FG.

According to the aforementioned configuration, the same effects obtained by the configuration shown in Embodiment 1 can be obtained. Therefore, as shown in FIGS. 5 and 6, a write operation can be performed with a low (<10 uA/cell) channel current that does not cause element deterioration from self-heating because of a weak inversion state of the channel in the region A (the first region). Therefore, according to the aforementioned memory cell 40, even when it is formed on an insulating substrate having a low heat dissipating characteristic, such as a glass substrate or the like, transistor characteristics do not deteriorate. Therefore, this memory cell 40 is suitable for a display device (particularly a liquid crystal display device).

Embodiment 3

Embodiment 3 according to the present invention is explained below. To facilitate explanation, the same reference characters are used for members having the same functions as the members shown in the aforementioned Embodiment 1, and explanations thereof are omitted. Furthermore, terms defined in Embodiment 1 are also used in this embodiment in the same manner as Embodiment 1 unless specifically indicated otherwise.

The schematic configuration of the liquid crystal display device according to Embodiment 3 is the same as the configuration shown in Embodiment 1, and includes a memory cell array 10a that is constituted of a plurality of memory cells 50 arranged in a matrix.

The memory cell array 10a is constituted of a plurality of electrically rewritable memory cells 50 respectively arranged in the row direction as well as in the column direction, thus arranged in a matrix. Each memory cell 50 is constituted of a selective transistor 11 for selecting a memory cell, a memory transistor 12 for storing information, and a MOS capacitor 13.

Figure 10:
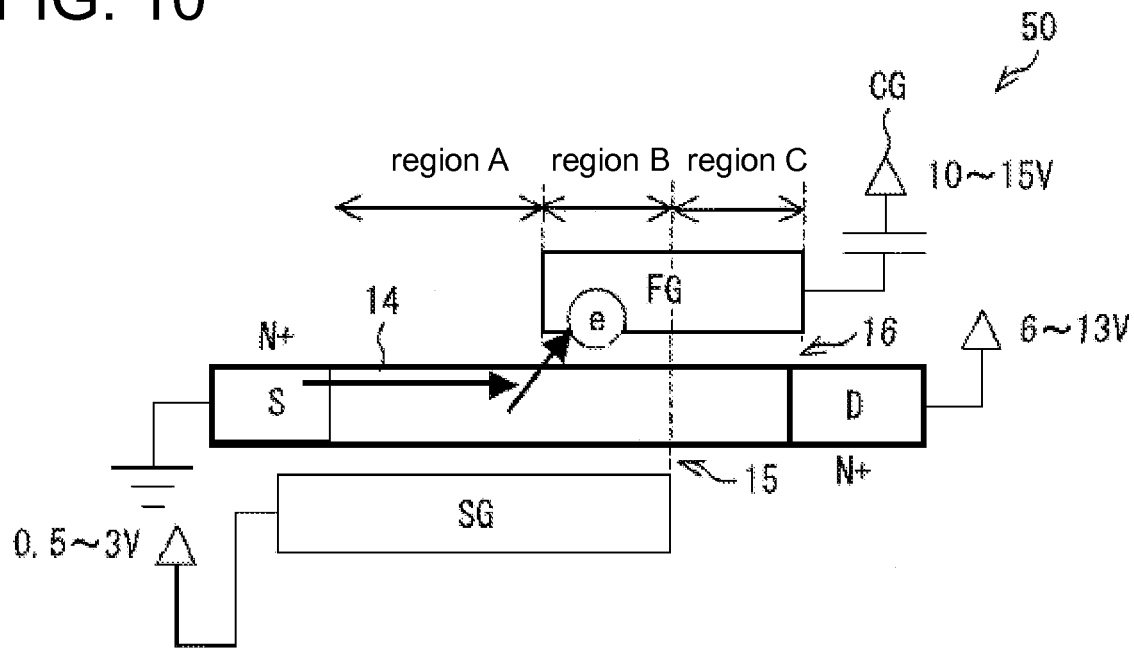
FIG. 10 is a schematic view showing a configuration of a memory cell according to Embodiment 3.
Figure 11:
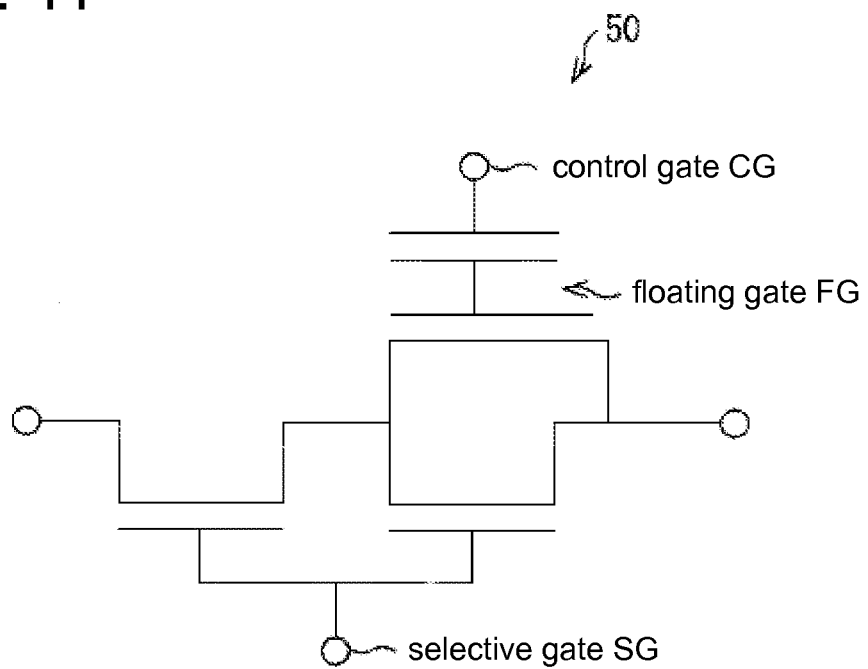
FIG. 11 is an equivalent circuit diagram of the memory cell shown in FIG. 10.

FIG. 10 is a schematic view showing a configuration of the memory cell 50 according to Embodiment 3, and FIG. 11 is an equivalent circuit diagram of the memory cell 50. The memory cell 50 according to Embodiment 3 has a configuration having a region C provided between the region B and the drain region D between the source S and the drain D regions of the memory cell 10 of Embodiment 1 shown in FIG. 2 (and FIG. 3).

As shown in FIGS. 10 and 11, in the memory cell 50, a selective gate SG is formed to connect to (overlap) the source region S through a gate insulating film 15 and not to connect to (overlap) the drain region D below a silicon layer 14 that becomes a channel between a pair of source S and drain D regions of the transistor (regions A and B). A floating gate FG that becomes a charge storage layer is formed over the silicon layer 14 to connect to (overlaps) the drain region D through a gate insulating film 16 (regions B and C). Furthermore, the floating gate FG does not connect to (overlap) the source region S, and is not formed over the silicon layer 14 in the region A (the region between the end of the floating gate FG on the source side and the source).

Therefore, between the source S and drain D regions, in the region A that is adjacent to the source region S, the selective gate SG is formed below the silicon layer, and in the region B that is adjacent to the region A, the selective gate SG is formed below the silicon layer 14 and the floating gate FG is formed over the silicon layer 14, and in the region C that is adjacent to the region B and the drain region D, the floating gate FG is formed over the silicon layer 14.

Therefore, the channel of the silicon layer 14 in the region A is controlled only by a MOS transistor formed by the selective gate SG that becomes the selective transistor 11, and the channel of the silicon layer 14 in the region B is controlled by two transistors connected in parallel: the MOS transistor formed by the selective gate SG that extends from the region A and a MOS transistor formed by the floating gate FG. The channel of the silicon layer 14 in the region C is controlled only by the MOS transistor formed by the floating gate FG. Furthermore, because the region C, like the region B, becomes a strong inversion state due to an electric field from the floating gate FG, effects of presence or absence of the selective gate SG below the silicon layer 14 to which a low voltage is applied can be ignored.

According to the aforementioned configuration, the same effects obtained by the configuration shown in Embodiment 1 can be obtained. Therefore, as shown in FIGS. 5 and 6, a write operation can be performed with a low (<10 uA/cell) channel current that does not cause element deterioration from self-heating because of a weak inversion state of the channel in the region A (the first region). Therefore, according to the aforementioned memory cell 50, even when it is formed on an insulating substrate having a low heat dissipating characteristic, such as a glass substrate or the like, transistor characteristics do not deteriorate. Therefore, this memory cell 50 is suitable for a display device (particularly a liquid crystal display device).

Here, the memory cell of the present invention may have the following configurations.

For example, the memory cell shown in FIG. 10 may be constituted of a region A and a region C that are adjacent to each other without a region B. Therefore, this is an example in which between the source S and drain D regions, a selective gate SG is formed below a silicon layer in the region A that is adjacent to the source region S, and a floating gate FG is formed over the silicon layer 14 in the region C that is adjacent to the region A and adjacent to the drain region D.

In this embodiment, the channel of the silicon layer 14 in the region A is controlled only by the MOS transistor formed by the selective gate SG that becomes the selective transistor 11, and the channel of the silicon layer 14 in the region C is controlled only by the MOS transistor formed by the floating gate FG.

Also, in this embodiment, the region A (the region where the selective gate SG is formed) and the region C (the region where the floating gate FG is formed) may be separated in a horizontal direction (horizontal direction on paper in FIG. 10) from the source region S towards the drain region D. Furthermore, in this configuration, because a channel of the region between the selective gate SG and the floating gate FG needs to be controlled by a fringe electric field of one of the gate electrodes, the distance between the region A and the region C is preferably within 200 nm.

In addition, similar to configuration of FIG. 8, these embodiments may take a configuration where the positions of the aforementioned region A (the region where the selective gate SG is formed) and the region C (the region where the floating gate FG is formed) are reversed; i.e., a configuration in which between the source S and drain D regions, the selective gate SG is formed over the silicon layer in the region A that is adjacent to the source region S, and the floating gate FG is formed below the silicon layer 14 in the region C that is adjacent to the region A and adjacent to the drain region D.

Figure 12:
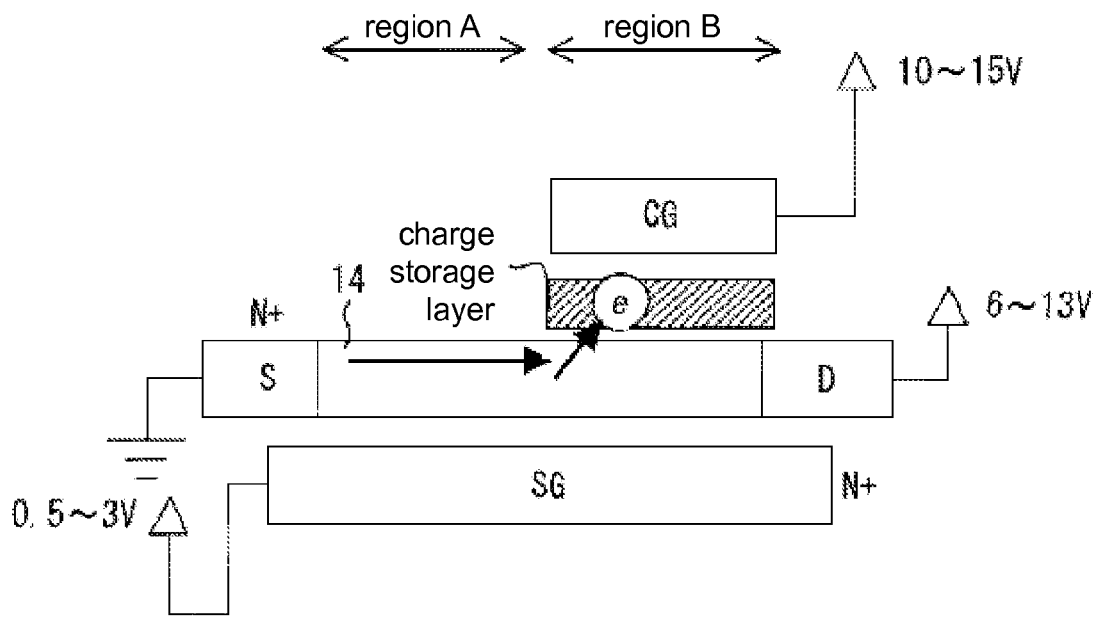
FIG. 12 is a schematic view showing another configuration of a memory cell according to Embodiments 1 to 3.
Figure 13:
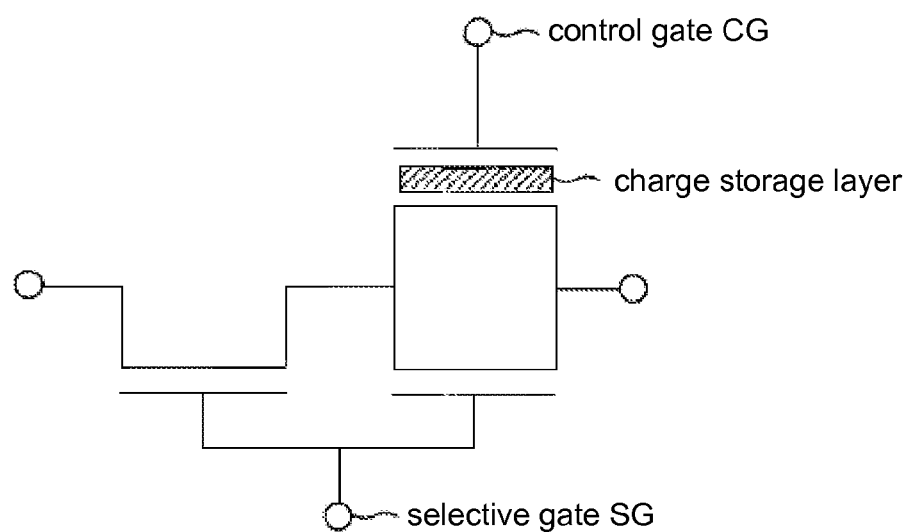
FIG. 13 is an equivalent circuit diagram of the memory cell shown in FIG. 12.
Figure 14:
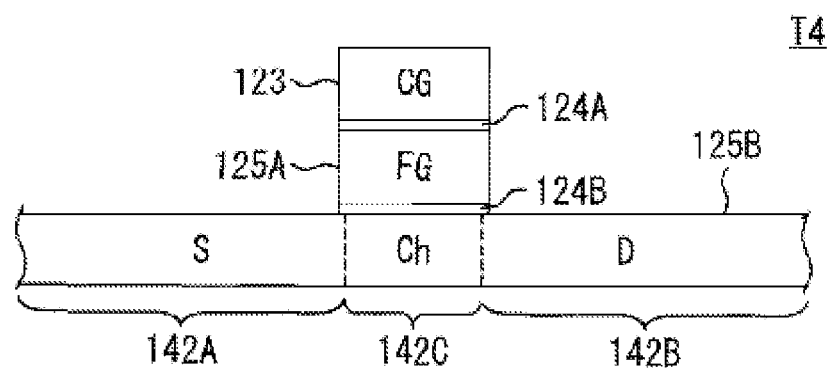
FIG. 14 is a schematic view showing a configuration of the nonvolatile memory of Patent Document 1.
Figure 15:
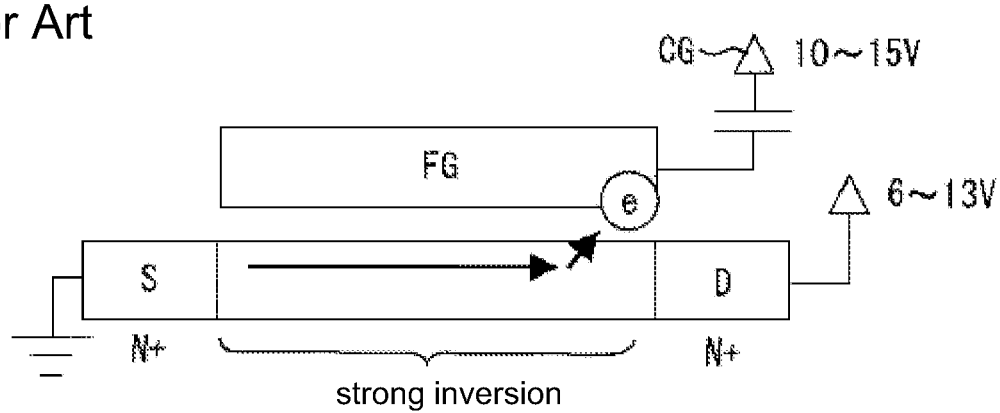
FIG. 15 is a diagram to explain a write operation in the nonvolatile memory shown in FIG. 14.

Furthermore, in the respective memory cells shown in Embodiments 1 to 3, the charge storage layer of the memory transistor 12 is constructed of a conductor as a gate electrode (floating gate FG). However, the memory cell of the present invention is not limited to this, and the aforementioned charge storage layer may be constructed of an insulating layer (the third insulating film) having a high trap density, for example. Specifically, as shown in FIGS. 12 and 13, the aforementioned charge storage layer can be constituted of a transistor that is separated by a semiconductor layer and a gate insulating film as well as by a control gate CG and an insulating film. The same effects obtained by the configurations of the memory cell shown in the aforementioned Embodiments 1 to 3 can be obtained by this configuration as well.

In addition, the respective memory cells (memory systems) shown in the aforementioned Embodiments 1 to 3 are not limited to the aforementioned configurations in which they are arranged in rows and columns corresponding to pixels in a pixel region of a liquid crystal display device, and may have a configuration where they are separately arranged as an array of nonvolatile memory cells in a peripheral circuit region outside a pixel region.

As described above, the nonvolatile memory of the present invention is a nonvolatile memory that retains data in a nonvolatile manner and that is constituted of a transistor, and is provided with the following: a first gate electrode that is formed through a first insulating film over at least one portion of one surface of a semiconductor layer that becomes a channel region formed between a source region and a drain region of the aforementioned transistor; a charge storage layer that is formed through a second insulating film over at least one portion of the other surface of the aforementioned semiconductor layer on an opposite side from the surface having the aforementioned first insulating film; and a control gate electrode that is connected to the aforementioned charge storage layer, wherein at least one end of the aforementioned first gate electrode overlaps the aforementioned source region through the aforementioned first insulating film, and one end of the aforementioned charge storage layer overlaps the aforementioned drain region through the aforementioned second insulating film, the other end thereof being separated from the aforementioned source region and overlapping the aforementioned semiconductor layer through the aforementioned second insulating film.

Hereinafter, it is assumed that, in the region between the source region and the drain region, a region where the first gate electrode is formed is the region A and that a region where the charge storage layer is formed is the region B.

In the aforementioned configuration, when the source is grounded, high voltages are applied to the drain and to the control gate electrode, and a low voltage is applied to the first gate electrode, because in the region A, the charge storage layer is not formed and only the first gate electrode is disposed to overlap the source region, a channel potential in the region A becomes lower than a channel potential in the region B. As a result, the potential difference between the source and the drain is concentrated in the bordering part of the region A and the region B, and a high electric field occurs in the bordering part (a high electric field is generated in the direction from the source region to the drain region (horizontal direction)). Therefore, during a write operation, electrons in the source region (hot electrons) become excited by this high electric field in the bordering part and become attracted to the charge storage layer side. Data are written when the electrons are taken into the charge storage layer.

Thus, according to the aforementioned configuration, even when a potential in a portion of the channel region is set lower, hot electrons can be injected into the charge storage layer by excitation at a portion (high electric field region) where a potential difference occurs. And, because a potential in the channel region can be lowered, the amount of the current flowing between the source region and the drain region can be lower than the conventional current amount, thereby preventing transistor characteristics deterioration due to self-heating. Therefore, the nonvolatile memory of the present invention does not deteriorate performance even when it is formed on an insulating substrate having a low heat dissipating characteristic, such as a glass substrate and the like constituting a liquid crystal panel.

In the aforementioned non volatile memory, between the aforementioned source region and the aforementioned drain region, the first region that is adjacent to the aforementioned source region may be configured such that one end of the aforementioned first gate electrode overlaps the aforementioned source region through the aforementioned first insulating film, and that the first regions includes the first gate electrode. The second region on the opposite side from the aforementioned source region that is adjacent to the aforementioned first region may be configured such that at least one end of the aforementioned charge storage layer overlaps the aforementioned drain region through the aforementioned second insulating film, and that the second region includes the charge storage layer and the aforementioned first gate electrode.

In the aforementioned nonvolatile memory, between the aforementioned source region and the aforementioned drain region, the first region that is adjacent to the aforementioned source region may be configured such that one end of the aforementioned first gate electrode overlaps the aforementioned source region through the aforementioned first insulating film, and that the first region includes the first gate electrode. The second region on the opposite side from the aforementioned source region that is adjacent to the aforementioned first region may be configured such that one end of the aforementioned charge storage layer and the other end of the aforementioned first gate electrode overlap the aforementioned drain region through the aforementioned second insulating film and the aforementioned first insulating film, respectively, and that the second region includes the charge storage layer and the first gate electrode.

In the aforementioned nonvolatile memory, between the aforementioned source region and the aforementioned drain region, the first region that is adjacent to the aforementioned source region may be configured such that one end of the aforementioned first gate electrode overlaps the aforementioned source region through the aforementioned first insulating film, and that the first region includes the first gate electrode. The second region on the opposite side from the aforementioned source region that is adjacent to the aforementioned first region may be constituted of the aforementioned first gate electrode and the aforementioned charge storage layer, and the third region that is adjacent to the aforementioned second region and the aforementioned drain region may be configured such that one end of the aforementioned charge storage layer overlaps the aforementioned drain region through the aforementioned second insulating film, and that the second region includes the charge storage layer.

In the aforementioned nonvolatile memory, the aforementioned charge storage layer may be constituted of the second gate electrode or the third insulating film.

The aforementioned nonvolatile memory may have a configuration in which a voltage applied to the aforementioned first gate electrode is set to a threshold voltage of a selective transistor that includes the aforementioned first gate electrode.

The display device of the present invention is a display device having a plurality of pixels arranged in rows and columns, a plurality of word lines and bit lines arranged in rows and columns corresponding to the respective pixels, wherein each pixel includes the aforementioned nonvolatile memory, the aforementioned first gate electrode is connected to the aforementioned word line, and the drain electrode of the aforementioned transistor is connected to the aforementioned bit line.

Also, the display device of the present invention is a display device having a plurality of pixels arranged in rows and columns and a plurality of word lines, bit lines, control lines and signal lines arranged corresponding to the respective pixels, wherein each pixel includes a nonvolatile memory according to any one of the embodiments above, the aforementioned nonvolatile memory is constituted of the first, second and third transistors, the aforementioned first transistor has a gate electrode connected to the aforementioned word line and the first conductive terminal connected to the aforementioned signal line, the aforementioned second transistor has a gate electrode connected to the aforementioned word line, the first conductive terminal connected to the second conductive terminal of the aforementioned first transistor, and the second conductive terminal connected to the aforementioned bit line, and the aforementioned third transistor has a gate electrode connected to the aforementioned control line through a capacitance, the first conductive terminal connected to the second conductive terminal of the aforementioned first transistor, and the second conductive terminal connected to the aforementioned bit line.

Furthermore, the aforementioned nonvolatile memory (memory system) is not limited to the aforementioned configurations in which the memory is arranged in rows and columns corresponding to pixels in a pixel region of a display device, and may have a configuration in which it is separately arranged as an array of nonvolatile memories in a peripheral circuit region outside the pixel region.

According to the aforementioned configurations, because the transistor characteristics do not deteriorate even when a nonvolatile memory is formed on a substrate having a low heat dissipating characteristic, such as a glass substrate or the like, it can be applied to display devices, particularly liquid crystal display devices.

In the aforementioned display device, the aforementioned first gate electrode may be made of the same material as a light-shielding layer for shielding leaked light and may be formed in the same layer as the light-shielding layer.

Accordingly, a nonvolatile memory can be formed without adding steps to a conventional method for manufacturing liquid crystal panels.

The method for manufacturing the nonvolatile memory of the present invention is a method for manufacturing a nonvolatile memory that retains data in a nonvolatile manner and that is constituted of a transistor, and includes the following steps: a step of forming a semiconductor layer that becomes a channel region between the source region and the drain region of the aforementioned transistor; a step of forming the first gate electrode over at least one portion of one surface of the aforementioned semiconductor layer such that at least one end of the first gate electrode overlaps the aforementioned source region through the first insulating film; a step of forming a charge storage layer over at least one portion of the other surface of the aforementioned semiconductor layer on an opposite side from the surface having the aforementioned first insulating film such that one end of the charge storage layer overlaps the aforementioned drain region through the second insulating film and that the other end is separated from the aforementioned source region and overlaps the aforementioned semiconductor layer through the second insulating film; and a step of forming a control gate electrode that is connected to the aforementioned charge storage layer.

According to the aforementioned method, effects from the configurations of the aforementioned nonvolatile memory can be obtained.

The present invention is not limited to the aforementioned embodiments, and those obtained by appropriately changing the aforementioned embodiments based on general technical knowledge and/or by combining them are included in embodiments of the present invention.

Industrial Applicability

The nonvolatile memory of the present invention is suitable for liquid crystal display device, for example, liquid crystal televisions, because it can be formed on an insulating substrate such as a glass substrate and the like.

DESCRIPTIONS OF REFERENCE CHARACTERS 10 memory cell (nonvolatile memory)
10a memory cell array
11 selective transistor (first transistor, second transistor)
12 memory transistor (third transistor)
13 MOS capacitor
14 silicon layer (semiconductor layer)
15 gate insulating film (first insulating film)
16 gate insulating film (second insulating film)
100 liquid crystal display device (display device)
SG selective gate (first gate electrode)
FG floating gate (second gate electrode)
CG control gate
WL word line
BL bit line
CL control line
SL source line (signal line)

The invention claimed is:

1. A nonvolatile memory that retains data in a nonvolatile manner, formed of a transistor, comprising:
   a first gate electrode formed over at least one portion of one surface of a semiconductor layer that becomes a channel region formed between a source region and a drain region of said transistor through a first insulating film;
   a charge storage layer formed over at least one portion of the other surface of said semiconductor layer on an opposite side from the one surface having said first insulating film through a second insulating film; and
   a control gate connected to said charge storage layer,
   wherein at least one end of said first gate electrode overlaps said source region through said first insulating film,
   wherein one end of said charge storage layer overlaps said drain region through said second insulating film, and the other end is separated from said source region and overlaps said semiconductor layer through said second insulating film,
   wherein:
   between said source region and said drain region,
   in a first region that is adjacent to said source region, one end of said first gate electrode overlaps said source region through said first insulating film, and the first region includes said first gate electrode; and
   in a second region that is adjacent to said first region on an opposite side from said source region, at least one end of said charge storage layer overlaps said drain region through said second insulating film, and the second region includes said charge storage layer and said first gate electrode.

2. A nonvolatile memory that retains data in a nonvolatile manner, formed of a transistor, comprising:
   a first gate electrode formed over at least one portion of one surface of a semiconductor layer that becomes a channel region formed between a source region and a drain region of said transistor through a first insulating film;
   a charge storage layer formed over at least one portion of the other surface of said semiconductor layer on an opposite side from the one surface having said first insulating film through a second insulating film; and
   a control gate connected to said charge storage layer,
   wherein at least one end of said first gate electrode overlaps said source region through said first insulating film,
   wherein one end of said charge storage layer overlaps said drain region through said second insulating film, and the other end is separated from said source region and overlaps said semiconductor layer through said second insulating film,
   wherein:
   between said source region and said drain region,
   in a first region that is adjacent to said source region, one end of said first gate electrode overlaps said source region through said first insulating film, and the first region includes said first gate electrode; and
   in a second region that is adjacent to said first region on an opposite side from said source region, one end of said charge storage layer and the other end of said first gate electrode overlap said drain region through said second insulating film and said first insulating film, respectively, and the second region includes said charge storage layer and said first gate electrode.

3. A nonvolatile memory that retains data in a nonvolatile manner, formed of a transistor, comprising:
   a first gate electrode formed over at least one portion of one surface of a semiconductor layer that becomes a channel region formed between a source region and a drain region of said transistor through a first insulating film;
   a charge storage layer formed over at least one portion of the other surface of said semiconductor layer on an opposite side from the one surface having said first insulating film through a second insulating film; and
   a control gate connected to said charge storage layer,
   wherein at least one end of said first gate electrode overlaps said source region through said first insulating film,
   wherein one end of said charge storage layer overlaps said drain region through said second insulating film, and the other end is separated from said source region and overlaps said semiconductor layer through said second insulating film,
   wherein:
   between said source region and said drain region,
   in a first region that is adjacent to said source region, one end of said first gate electrode overlaps said source region through said first insulating film, and the first region includes said first gate electrode;
   in a second region that is adjacent to said first region on an opposite side from said source region, said first gate electrode and said charge storage layer are present; and
   in a third region that is adjacent to said second region and is adjacent to said drain region, the other end of said charge storage layer overlaps said drain region through said second insulating film, and the third region includes said charge storage layer.

4. A nonvolatile memory that retains data in a nonvolatile manner, formed of a transistor, comprising:
   a first gate electrode formed over at least one portion of one surface of a semiconductor layer that becomes a channel region formed between a source region and a drain region of said transistor through a first insulating film;
   a charge storage layer formed over at least one portion of the other surface of said semiconductor layer on an opposite side from the one surface having said first insulating film through a second insulating film; and
   a control gate connected to said charge storage layer,
   wherein at least one end of said first gate electrode overlaps said source region through said first insulating film,
   wherein one end of said charge storage layer overlaps said drain region through said second insulating film, and the other end is separated from said source region and overlaps said semiconductor layer through said second insulating film, and wherein a voltage applied to said first gate electrode is set to a threshold voltage of a selective transistor that includes said first gate electrode.

* * * * *